United States Patent [19]

Yin

[11] Patent Number: 4,912,344

[45] Date of Patent: Mar. 27, 1990

[54] TTL OUTPUT STAGE HAVING AUXILIARY DRIVE TO PULL-DOWN TRANSISTOR

[75] Inventor: Patrick Y. C. Yin, San Jose, Calif.

[73] Assignee: Fairchild Camera and Instrument Corporation, Mountain View, Calif.

[21] Appl. No.: 475,810

[22] Filed: Mar. 16, 1983

[51] Int. Cl.[4] .......................................... H03K 19/013
[52] U.S. Cl. .................................... 307/456; 307/443; 307/270
[58] Field of Search ............... 307/455, 456, 473, 475, 307/443, 254, 270

[56] References Cited

U.S. PATENT DOCUMENTS

| 4,237,388 | 12/1980 | Nokubo et al. | 307/300 X |
| 4,280,065 | 7/1981 | Minato et al. | 307/473 |
| 4,311,927 | 1/1982 | Ferris | 307/473 |
| 4,631,422 | 12/1986 | Piasecki | 307/456 X |

FOREIGN PATENT DOCUMENTS 3024274 12/1981 Fed. Rep. of Germany.
58-19032 2/1983 Japan.

OTHER PUBLICATIONS

"Totem Pole Driver for High-Capacitance Loads," E. Colao et al., IBM Tech. Disclosure Bulletin, vol. 18, No. 11, Apr. 1976, pp. 3649-3650.
"Bit-Slice Parts Approach ECL Speeds with TTL Power Levels", D. Mrazek, Electronics International, vol 51, No. 23, Nov. 1978, pp. 107-112.
"A Masterslice LSI For Subnanosecond Random Logic", W. Braeckelmann et al., IEEE Journal of Solid State Circuits, vol. 14, No. 5, Oct. 1978, pp. 829-832.

Primary Examiner—David Hudspeth
Attorney, Agent, or Firm—Skjerven, Morrill, MacPherson, Franklin & Friel

[57] ABSTRACT

A novel output stage is provided for producing a TTL output signal in response to the differential output signals from an ECL switch. The output stage includes a translator portion to shift the levels of the complementary signals produced by the ECL switch to the appropriate levels for use in driving a TTL output stage, a phase splitter circuit which is driven by the level shifted complementary output signals from the ECL stage and a single output lead. The currents through the level shifting transistors and resistors are controlled by a single current reference generator. The output signals from the translator circuit have voltage levels substantially independent of variations in the power supply voltage.

15 Claims, 3 Drawing Sheets

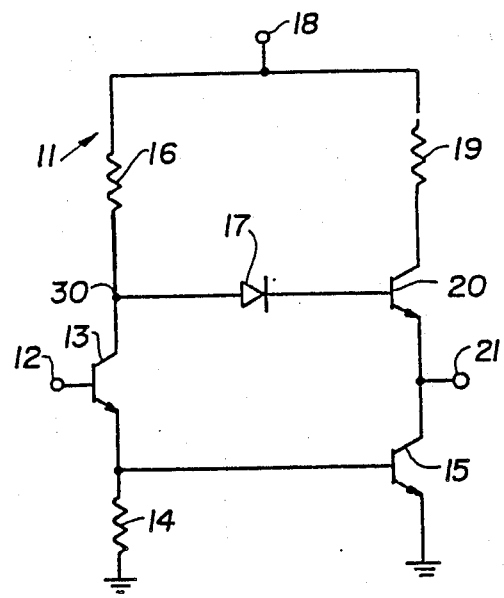
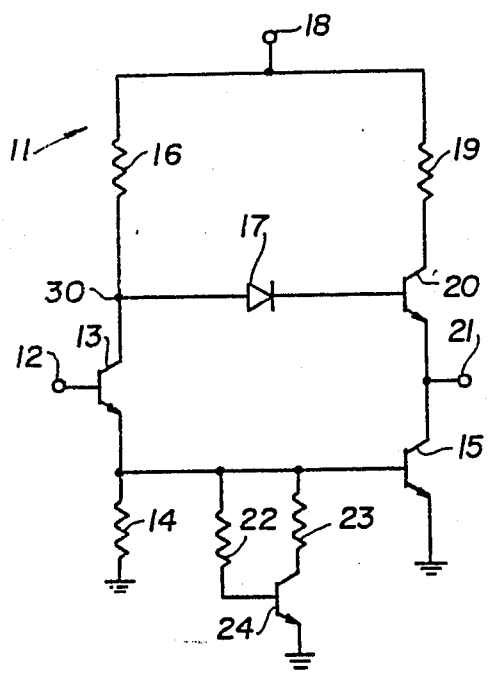
FIG. 2a
(PRIOR ART)
FIG. 1
(PRIOR ART)
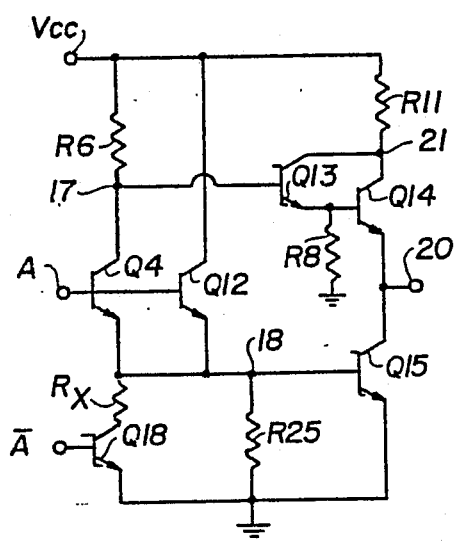
FIG. 3

TTL OUTPUT STAGE HAVING AUXILIARY DRIVE TO PULL-DOWN TRANSISTOR

BACKGROUND OF THE INVENTION

1. Field of the Invention

This invention relates to electronic circuits and more specifically to a Transistor-Transistor Logic (TTL) output stage. The output stage of this invention is particularly useful with an ECL-TTL logic level translator circuit.

2. Description of the Prior Art

TTL output stages are known in the prior art. For example, the circuit of FIG. 1 provides an output signal on its output terminal 21 in response to an input signal received on its input terminal 12. With terminal 18 connected to a positive voltage VCC, and a logical one signal (i.e. a "high" signal of typically 5 volts) applied to input terminal 12, NPN transistors 13 and 15 are turned on, thus grounding output terminal 21. At the same time, the collector of transistor 13 is low, thus preventing NPN transistor 20 from turning on. Thus output terminal 21 provides a low output voltage in response to a high input signal applied to input terminal 12. Conversely, with a logical zero signal (i.e. a "low" signal of typically zero volts) applied to input terminal 12, transistor 13 is turned off, and the base of transistor 15 is grounded through resistor 14, thus causing transistor 15 to remain off. At the same time, with transistor 13 turned off, node 30 is held to a high voltage and diode 17 and transistor 20 turn on. With transistor 20 turned on, output terminal 21 is connected through resistor 19 to positive supply voltage VCC applied to terminal 18. Thus, output terminal 21 provides a high output voltage in response to a low input signal applied to input terminal 12.

One disadvantage of the prior art circuit of FIG. 1 is that the turnoff speed of transistor 15 in response to an input signal transition from a logical one to a logical zero, is rather slow. One approach to increase the turnoff speed of transistor 15 is shown in the circuit of FIG. 2a. With the addition of resistors 22 and 23 and NPN pulldown transistor 24, the turnoff speed of transistor 15 is increased. Such a so-called "squaring circuit" provided by resistors 22 and 23 and transistor 24 is described in U.S. Reissue Pat. No. 27,804 issued Oct. 30, 1973 on an invention of Treadway.

Yet another disadvantage in the prior art circuits of FIG. 1 and FIG. 2a is that, with a logical one applied to input terminal 12, a rather large amount of current flows through resistor 14 (FIG. 1) and resistors 14, 22 and 23 (FIG. 2a). Resistor 14 is typically very large. The main purpose of this resistor is to increase the breakdown voltage of transistor 15. Typically, this resistive pull down current may be as much as 1 milliamp per output circuit. On a typical integrated circuit device having many output circuits, the total resistive pull down current required is appreciable, thus adding significantly to the power requirements of the device.

Another TTL output stage is described in U.S. Pat. No. 4,311,927 issued Jan. 19, 1982 on an invention of Ferris and assigned to Fairchild Camera and Instrument Corporation, the assignee of this invention. The Ferris structure utilizes a unique circuit arrangement wherein the effects of the Miller capacitances are minimized.

An additional TTL output stage is shown in the circuit of FIG. 2b. The output stage of FIG. 2b utilizes diode D1 as a capacitor which momentarily causes pulldown transistor Q1 to conduct during the transition of transistor Q4 from the conducting state to the non-conducting state. For example, with a logical one signal applied to input terminal A, transistor Q11 conducts, thus causing transistor Q4 to conduct, thereby grounding output terminal B. With transistor Q11 conducting, its collector (node 19) is low, thus causing transistors Q2 and Q3 to remain off. When a logical zero is applied to input terminal A, transistor Q11 turns off, the voltage on its collector (node 19) goes high, thus turning on transistors Q2 and Q3, thereby providing a high output signal at output terminal B. Simultaneously, with node 19 high, the capacitor provided by the reverse biased PN junction of diode D1 charges, thereby temporarily providing current flow between the base and emitter of pulldown transistor Q1, thereby temporarily turning on transistor Q1. With transistor Q1 conducting, the base of transistor Q4 is connected to ground, thereby forcing transistor Q4 to turn off quickly in response to a high to low transition of the input signal applied to input terminal A. However, as in the prior art circuit of FIG. 2a, the circuit of FIG. 2b utilizes pull down resistors R3 and R4 and transistor Q5 to conduct current from the emitter of transistor Q11 to ground, thereby adding to the current requirements of this output circuit.

SUMMARY

In accordance with the teachings of this invention, a novel ECL-TTL logic level translator and TTL output stage is provided wherein complementary input signals are applied to the TTL output stage. One of the complementary input signals controls the operation of the output stage, and the other complementary input signal serves solely to cause the base of one of the two output transistors to be pulled low, thereby causing said output transistor to quickly turn off as required.

BRIEF DESCRIPTION OF THE DRAWING

FIG. 1 is a schematic diagram of prior art TTL output stage;

FIG. 2a is a schematic diagram of another prior art TTL output stage;

FIG. 3 is a schematic diagram of one embodiment of a TTL output stage constructed in accordance with this invention.

DETAILED DESCRIPTION

One embodiment of a TTL output stage constructed in accordance with this invention is shown in schematic diagram of FIG. 3. As shown in FIG. 3, two complementary input signals A and $\overline{A}$ are applied to the bases of transistors Q4 and Q12, and to the base of transistor Q18, respectively. With a high input signal A applied to the bases of NPN transistors Q4 and Q12, transistors Q4 and Q12 turn on thus providing base current to NPN transistor Q15, thereby causing transistor Q15 to turn on and ground output terminal 20. With transistor Q4 turned on, node 17 is low, thus causing NPN transistors Q13 and Q14 to remain off, thereby effectively disconnecting output terminal 20 from the positive supply voltage VCC. Resistor R8, connected between the base of transistor Q14 and ground, serves to discharge the base of transistor Q14 when node 17 is low, thus causing transistor Q14 to turn off. Furthermore, with a high input signal A, complementary input signal $\overline{A}$ is low, thus causing NPN transistor Q18 to remain off.

Conversely, with a low data input signal A applied to the bases of NPN transistors Q4 and Q12, transistors Q4 and Q12 turn off. With transistor Q4 off, node 17 is high, thus causing NPN transistors Q13 and Q14 to turn on, thus applying the positive supply voltage VCC through resistor R11 and transistor Q14 to output terminal 20. Furthermore, with a low input signal A, complementary input signal $\overline{A}$ is high, thus causing NPN transistor Q18 to turn on, thus grounding the base of NPN transistor Q15, thereby causing transistor Q15 to quickly turn off. Resistor R25, connected between the base of transistor Q15 and ground, is typically around 10K to 20K ohms and serves to increase the collector-emitter breakdown voltage of transistor Q15. With transistor Q15 off, the output terminal 20 is disconnected from ground. The value of resistor Rx is determined in order to maximize the switching speed of the output circuit at a given operating temperature. The value of Rx typically is within the range of 100 to 500 ohms. A value of RX within this range optimizes the cold temperature propagation delay of the circuit. As the circuit warms up to its operating temperature the propagation delay becomes a little worse.

Figure 2B:
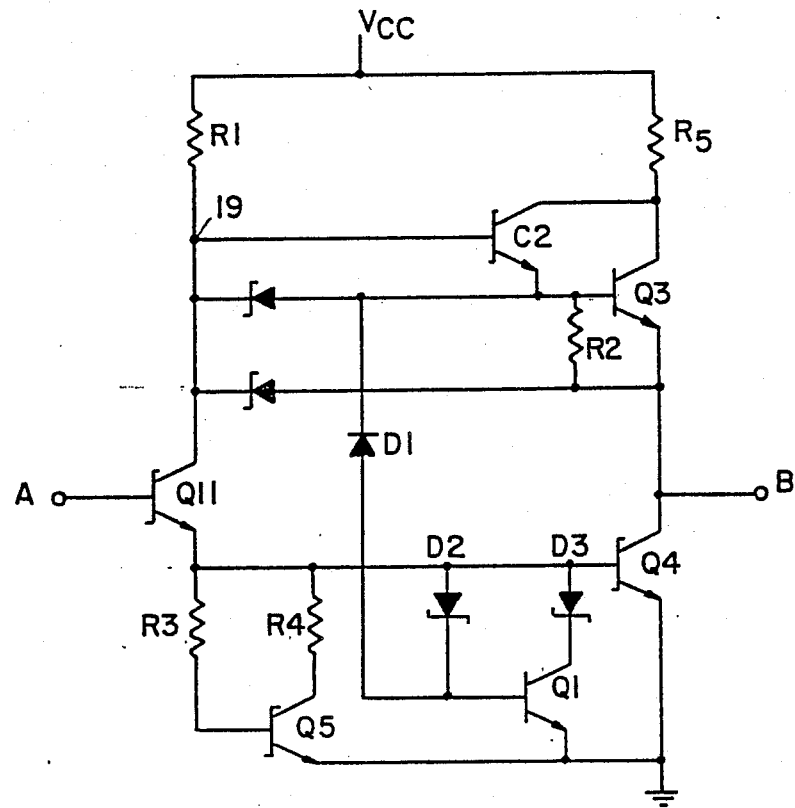
FIG. 2b is a schematic diagram of yet another prior art TTL output stage.

The structure of FIG. 3 saves current over the prior art circuit shown in FIGS. 1 and 2 because by making sure the Q15 turns off first, there is no time period when both Q14 and Q15 are on thereby preventing current from flowing from DCC to ground through these two transistors. At the same power, the speed of the circuit of FIG. 3 is increased over the prior art.

Figure 4:
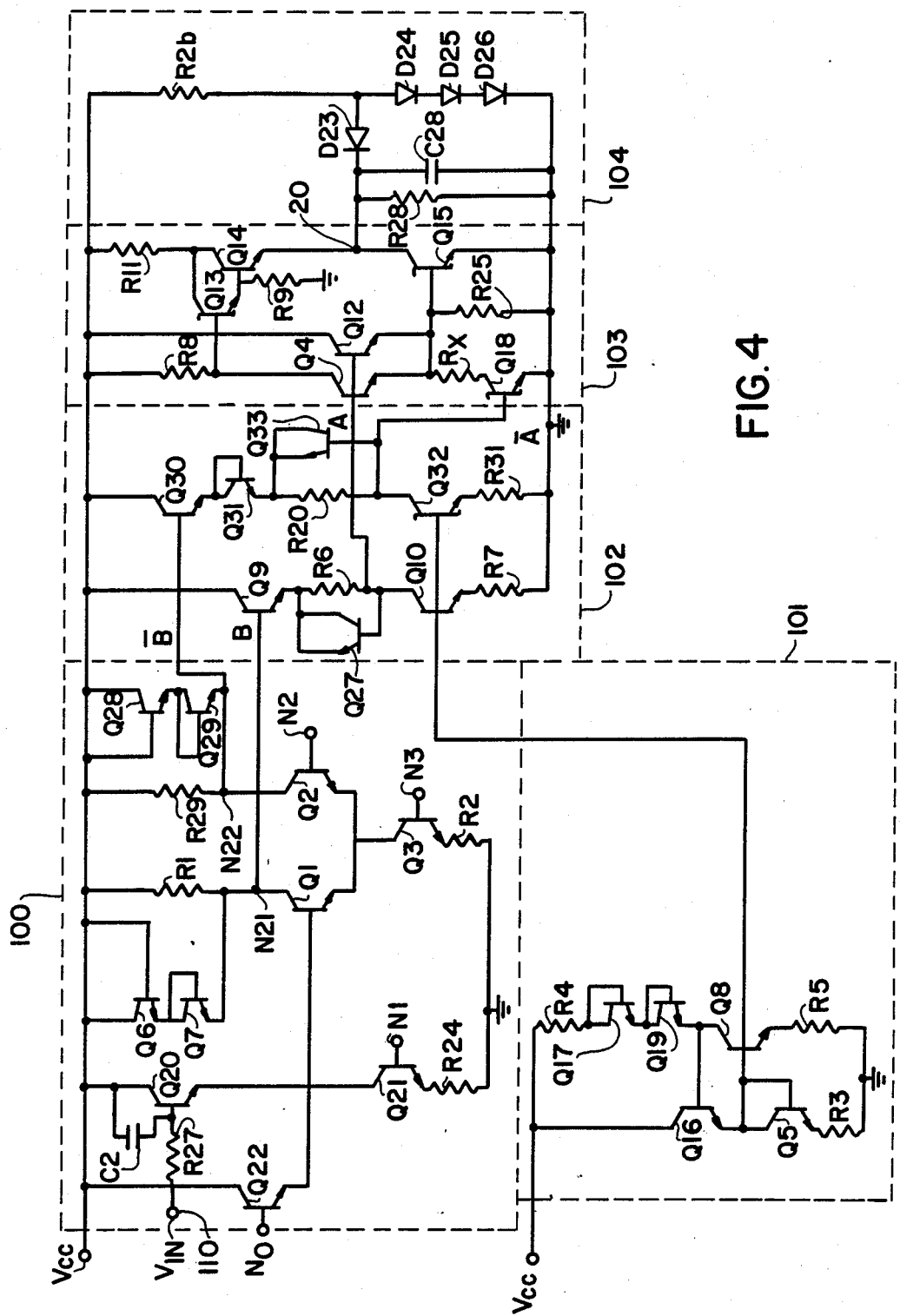
FIG. 4 is a schematic diagram of one embodiment of a TTL output stage constructed in accordance with this invention shown connected to Emitter Coupled Logic (ECL) gate, an ECL-TTL voltage level translator, a bias network, and a load circuit.

FIG. 4 shows a schematic diagram of one embodiment of a TTL output stage 103 constructed in accordance with this invention, together with ECL-TTL level translator stage 102, ECL gate 100, bias voltage generator 101, and output test circuit 104. ECL gate 100 includes current source transistors Q21 and Q3, having their bases connected to a first reference voltage through nodes N1 and N3, respectively. Transistors Q1 and Q2 form a typical ECL current steering network, with the current provided by current source transistor Q3 being primarily handled by either transistor Q1 or Q2, depending upon the input voltage $V_{IN}$ applied to input terminal 110. The bases of transistors Q22 and Q2 are connected to a second reference voltage via nodes N0 and N2, respectively.

With a logical one input signal $V_{IN}$ applied to input terminal 110, the base of NPN transistor Q20 is high, thus causing transistor Q20 to conduct. When interfacing with standard ECL logic levels, Q20 and Q21 are used to translate that standard level to the internal level whose reference is at the base of transistor Q2. Furthermore, transistor Q22 provides base current to transistor Q1, thus causing transistor Q1 to turn on. Of importance when $V_{IN}$ is high (logical one), the voltage applied to the base of transistor Q1 is greater than the voltage applied to the base of transistor Q2, and thus current supplied by current source transistor Q3 is steered through transistor Q1 and resistor R1, thus causing node N21 (and thus signal B) to go low. Simultaneously, current does not flow through resistor R29 and transistor Q2, thus causing node N22 (and thus signal $\overline{B}$) to go high. Q20 never turns off under normal operating conditions.

Conversely, with a logical zero input signal $V_{IN}$ applied to input terminal 110, a low level signal is translated and transferred to the base of Q1. Thus Q22 serves as a voltage clamp for the input circuit. If at anytime $V_{IN}$ (terminal 110) becomes disconnected, the base of Q1 would follow the emitter voltage of Q22, Q20 which at this point is determined by the base voltage of Q22. The base voltage of Q22 is supplied by an internal reference generator. The current supplied by current source transistor Q3 is steered through transistor Q2, thus causing node N22 (signal $\overline{B}$) to go low. Furthermore, since the current is not steered through transistor Q1 and resistor R1, node N21 (signal B) goes high.

Voltage translator stage 102 converts the ECL level logical zero (~3.4 volts) and logical one (~5 volts) signals B and $\overline{B}$ on nodes N21 and N22, respectively, to the lower voltage levels for signal A and $\overline{A}$. With a logical zero $\overline{B}$ signal, A has a high level of 3VBE and low level of 1VBE. $\overline{A}$ has a high of 2VBE and a low of ~0v (1VBE equals ~0.8 Volt) thus providing a logical zero $\overline{A}$ signal effectively turning Q18 off. With a logical zero $\overline{B}$ signal, the B signal is high, thus providing a logical one A signal and turning Q4 and Q12 on and providing base current to transistor Q15.

Conversely, with a logical one $\overline{B}$ signal, transistor Q30 turns on, thus providing a logical one $\overline{A}$ signal. With a logical one $\overline{B}$ signal, B is low, thus transferring a low level to A. These A and $\overline{A}$ signals are applied to transistors Q4, Q12 and transistor Q18, respectively, of TTL output stage 103, as previously described in conjunction with FIG. 3.

The benefits of using complementary signals A, $\overline{A}$ on the "phase splitter" comprising Q4, Q12 and Q18 are (1) no quiescent power
(2) higher speed due to quicker turn-off of Q18.

Output test stage 104 comprises diodes D23 through D26, resistors R2b and R28, and capacitor C28. This structure is well known in the prior art and provides a means for measuring the switching speed of the output signal available on terminal 20 in response to a variety of input signals $V_{IN}$ applied to input terminal 110.

Bias generator stage 101 provides a voltage to the bases of transistors Q10 and Q32 which is independent of the value of the supply voltage $V_{CC}$. In this manner, proper operation of the ECL-TTL voltage converter 102 and the TTL output stage 103 constructed in accordance with this invention is assured regardless of the actual supply voltage $V_{CC}$ (i.e., output voltage levels are insensitive to the supply voltage $V_{CC}$). Of importance, a single bias voltage generator 101 is used to supply the base bias voltage to a plurality of ECL-TTL voltage translator stages 102 when a single integrated circuit device contains a plurality of output terminals, each output terminal being associated with one of a plurality of ECL-TTL voltage translator stages 102 and TTL output stages 103. In this manner, the number of components and the power requirements required to provide the bias voltage generated by bias voltage generator 101 is minimized.

Transistors Q6, Q7 and Q28, Q29 serve to provide a current path shunting resistors R1 and R29, respectively which, at high operating temperatures, insures that the logical zero B and $\overline{B}$ signal voltages are not so great as to cause excessively low A and $\overline{A}$ signal voltages, thereby insuring that transistor Q10 is not saturated. Maximum switching speed of transistors Q4, Q12 and Q18 is insured by this technique of preventing the saturation of transistors Q4, Q12 and Q18. The voltage compensation provided by transistors Q6, Q7 and Q28, Q29 is substantially identical to the voltage shift over temperature provided by transistors Q17, Q19 of bias voltage generator stage 101. Bias generator stage 101 mirrors a current in R7 and R31. At high temperature this current increases causing a bigger voltage drop across R6 and R20. Since VBE (the base-emitter junction voltage) decreases with increasing temperature, the change in VBE of Q6, Q7, Q28 and Q19 cancels the change in voltage drop across R6 and R20.

Transistors Q27 and Q33 within ECL-TTL voltage translator stage 102 serve as capacitors which are capable of quickly discharging their current to the bases of transistors Q4, Q12 and Q18, respectively, thereby allowing transistors Q4 and Q12 to turn on quickly in response to a high B signal generated by a low $V_{IN}$ signal, and allowing Q18 to quickly turn on in response to a high $\bar{B}$ signal generated by a high $V_{IN}$ signal.

In the above circuit, Q4, Q12 and Q18 work in a complementary mode. That is, when Q4 and Q12 are on, Q18 is off and visa versa. The advantages derived from this arrangement are (1) reduced power dissipation,
(2) reduced transient current at the output stage by being able to discharge the base of transistor Q15 at high speed, and
(3) improved AC performance.

Q27 and Q33 are connected as speed-up capacitors which improve the overall AC speed by at least 500 picoseconds. RX is added to improve the propagation delay through the circuit when the circuit is cold. For Rx equals 500 ohms, a typical propagation delay from high to low in nanoseconds is 3.675 nanoseconds and from low to high output is 4.1 nanoseconds. When the circuit becomes hot the high to low transition can take 5.2 nanoseconds while the low to high transition can take also 5.2 nanoseconds. When the circuit is cold a high to low transition can take 3.3 nanoseconds and a low to high transition can take 5.3 nanoseconds.

While two embodiments of this invention have been described other embodiments of this invention will be obvious in view of the above disclosure.

The above described circuit particularly translates ECL logic levels to TTL logic levels in a +5V system environment. The circuit can also be used as the output buffer for LSI devices, in which ECL logic gates are used for high AC performance and TTL output signals are provided for interfacing with the rest of the system. The disclosed circuit gives better AC performance for less power consumption, has less transient current at the totem pole output stage and lower sensitivity to power supply fluctuations than do prior art circuits.

In accordance with my invention an output stage is provided which accepts the complementary signals produced by an ECL switch of a type well known in the prior art and using these complementary input signals produces a single TTL output signal. In the output stage of my invention, a translating circuit is employed to shift the levels of the output signals from the ECL switch to appropriate input signal levels for input to the phase splitter portion of my output stage. The translater (shown as the circuitry within block 102 in FIG. 4) produces complementary output signals at an appropriate level to drive the output circuit (shown as the circuitry within block 103 in FIG. 4) in accordance with my invention. The output stage produces a high or low level output signal depending upon the state of the two complementary input signals driving the output stage. In addition, in accordance with my invention I provide a single source of reference current which is used to control currents in the translator. Thus as shown in FIG. 4, transistor Q10 with emitter resistor R7 is geometrically sized to be the same as transistor Q8 with emitter resistor R5 should it be desired to have exactly the same current pass through Q10 as passes through Q8. Also, Schottky transistor Q32 in FIG. 4 and its emitter resistor R31 are similarly sized to insure that the current through Q32 bears a desired relationship to the current through Q8. Thus, if this current is to be twice the current in Q8, the emitter area of Q32 (as viewed from the top of the semiconductor) is made twice the emitter area of Q8 for twice the current through Q32. R31 is made one-half the value of R5. Other currents, of course, can be obtained by appropriately adjusting the sizes of the emitter areas of Q10 and Q32 and resistors R7 and R31. Furthermore, fast switching speed of the output signal on terminal 20 is obtained by using differential signals (shown as A and $\bar{A}$ in FIG. 4) to drive the differential phase splitter comprising transistors Q4 and Q12 driven by input signal A and Schottky transistor Q18 driven by input signal $\bar{A}$.

The voltages of the signals A and $\bar{A}$ range from zero to 3VBE. Thus variations in power supply voltage $V_{CC}$ (typically five (5) volts± ten percent (10%)) have little effect on the voltage levels of A and $\bar{A}$.

The above description is means to be illustrative only and not limiting.

I claim:

1. A TTL output circuit comprising:
an output terminal 20;
a first power terminal Vcc for receiving a first supply voltage;
a second power terminal Gnd for receiving a second supply voltage;
a first output switch means comprising at least one bipolar transistor Q14, said first output switch means having a first current handling terminal, a second current handling terminal connected to said output terminal 20, and a control terminal;
a first resistive means R11 connected between said first power terminal Vcc and said first current handling terminal of said first output switch Q14;
a second output switch means comprising a bipolar transistor Q15 having an emitter, a base, and a collector, said emitter being connected to said second power terminal Gnd, and said collector being connected to said output terminal 20;
a first bipolar input transistor Q4 having an emitter connected to said base of said bipolar transistor Q15 of said second output switch means, a collector, and a base for receiving a first binary input data signal;
a second resistive means R6 connected between said first power terminal Vcc and said collector of said first bipolar input transistor Q4;
a second bipolar input transistor Q18 having a collector, a base for receiving the complement of said first binary input data signal, and an emitter connected to said second power terminal Gnd; and
a third resistive means RX connected between said emitter of said first bipolar input transistor Q4 and said collector of said second bipolar input transistor Q18, the resistance of said third resistive means RX being selected to maximize the switching speed of said output circuit at a given operating temperature.

2. The structure as in claim 1 wherein said second output switch means comprises a Schottky transistor.

3. An output circuit as in claim 1 further including:
means for receiving a first output signal and a second output signal complementary to said first output signal; and
means for translating the voltage level of said first output signal and said second output signal thereby to produce said first binary input data signal and said second binary input data signal respectively.

4. An output circuit as in claim 3 wherein said voltage levels of said first output signal and said second output signal are between (VCC-2VBE) and VCC, wherein Vcc is the level of said first supply voltage, and said voltage level of said first binary input data signal is between 1VBE and 3VBE and said voltage level of said second binary input data signal is between 0 volts and 2VBE where VBE is the voltage drop across a forward biased base-emitter junction.

5. An output circuit as in claim 3 including
means for generating a reference current; and wherein
said means for translating includes first means, connected to said base of said first bipolar input transistor, for generating a first current, and second means, connected to said base of said second bipolar input transistor, for generating a second current, the magnitude of said first and said second currents being controlled by the magnitude of said reference current.

6. An output circuit as in claim 1 further comprising a bipolar transistor having a collector connected to said first power terminal, a base connected to said base of said first bipolar input transistor and an emitter connected to said base of said bipolar transistor of said second output switch means.

7. An output circuit as in claim 6 further comprising a resistive means connected between said base of said bipolar transistor of said second output switch and said second power terminal.

8. An output circuit as in claim 1 wherein said first output switch means comprises:
a bipolar transistor Q14 having a collector connected to said first current handling terminal, an emitter connected to said output terminal 20 and a base;
a Schottky transistor Q13 having a base connected to said control terminal, a collector connected to said first current handling terminal, and an emitter connected to said base of said bipolar transistor Q14 of said output switch; and
a resistive means R8 connected between said emitter of said Schottky transistor and said second power terminal Gnd.

9. A TTL output circuit comprising:
an output terminal 20;
a first power terminal Vcc for receiving a first supply voltage Vcc;
a second power terminal for receiving a second supply voltage Gnd;
a first output switch means comprising at least one bipolar transistor Q14, said first output switch means having a first current handling terminal, a second current handling terminal connected to said output terminal 20, and a control terminal;
a first resistive means R11 connected between said first power terminal Vcc and said first current handling terminal of said first output switch;
a second output switch means Q15 comprising a bipolar transistor Q15 having an emitter, a base, and a collector, said emitter being connected to said second power terminal Gnd, and said collector being connected to said output terminal 20;
a first bipolar input transistor Q4 having an emitter connected to said base of said bipolar transistor Q15 of said second output switch means, a collector connected to said base of said at least one bipolar transistor of said first output switch means and a base for receiving a first binary input data signal;
a second resistive means R6 connected between said first power terminal Vcc and said collector of said first bipolar input transistor Q4;
a second bipolar input transistor Q18 having a collector connected to said emitter of said first bipolar input transistor Q4, a base for receiving the complement $\overline{A}$ of said first binary input data signal, and an emitter connected to said second power terminal Gnd; and
a bipolar transistor Q12 having a collector connected to said first power terminal Vcc, a base connected to said base of said first bipolar input transistor Q4 and an emitter connected to said base of said bipolar transistor Q15 of said second output switch means.

10. An output circuit as in claim 9 further comprising a resistive means connected between said base of said bipolar transistor of said second output switch means and said second power terminal.

11. The combination comprising:
first and second power terminals for the application therebetween of an operating potential;
first, second, third and fourth transistors of same conductivity type, each transistor having first and second electrodes defining the ends of its main conduction path, and a control electrode whose potential relative to said first electrode determines the conductivity of the transistor;
an input terminal and a control terminal;
means for applying external signals to said input and control terminals independent of the signals produced at the first and second electrodes of said first, second, third and fourth transistors;
an output terminal;
means coupling the main conduction path of said first transistor between said output terminal and said first power terminal;
means coupling the main conduction path of said second transistor between said output terminal and said second power terminal;
means coupling the main conduction path of said third transistor between the control electrodes of said first and second transistors;
means coupling the main conduction path of said fourth transistor between the control electrode of said first transistor and said first power terminal; and
first means coupling the control electrode of said third transistor to said input terminal and second means coupling the control electrode of said fourth transistor to said control terminal, said first and second means being responsive to the signals at said input and control terminals, for turning-on said fourth transistor and turning-off said first transistor when said third transistor is being turned-off, and for turning-off said fourth transistor and turning-on said first transistor when said third transistor is being turned-on.

12. The combination as claimed in claim 11, wherein said means coupling the main conduction path of said fourth transistor between the control electrode of said first transistor and said first power terminal includes resistive means.

13. The combination comprising:

first and second power terminals for the application therebetween of an operating potential;

first, second, third and fouth transistors of same conductivity type, each transistor having first and second electrodes defining the ends of its main conduction path, and a control electrode whose potential relative to said first electrode determines the conductivity of the transistor;

an input terminal and a control terminal;

means for applying external signals to said input and control terminals, said external signals being independent of the signals produced at the first and second electrodes of said first, second, third and fourth transistors;

an output terminal;

means coupling the main conduction path of said first transistor between said output terminal and said first power terminal;

means coupling the main conduction path of said second transistor between said output terminal and said second power terminal;

means coupling the main conduction path of said third transistor between the control electrodes of said first and second transistors;

means coupling the main conduction path of said fourth transistor between the control electrode of said first transistor and said first power terminal; and means coupling the control electrode of said third transistor to said input terminal and means coupling the control electrode of said fourth transistor to said control terminal, responsive to the signals at said input and control terminals, for turning-on said fourth transistor and turning off said first transistor when said third transistor is being turned-off.

14. The combination as claimed in claim 13 wherein each one of said transistors is a bipolar transistor having an emitter and a collector defining the ends of a main conduction path and a base, and wherein each one of said first electrodes is an emitter, each one of said second electrodes is a collector and each one of said control electrodes is a base; and wherein said first transistor is connected to operate in the common emitter mode and said second transistor is connected to operate in the emitter follower mode.

15. The combination as claimed in claim 14 further including means coupled between the control electrode of said second transistor and said second power terminal for biasing said second transistor into conduction when said third transistor is turned-off.

* * * * *